United States Patent
Harvey et al.

(10) Patent No.: US 12,439,522 B2
(45) Date of Patent: Oct. 7, 2025

(54) LIGHT MODULE WITH DISCRETE OPTICS AND METHODS OF ASSEMBLING SAME

(71) Applicant: ABL IP Holding LLC, Atlanta, GA (US)

(72) Inventors: John Bryan Harvey, Newark, OH (US); Craig Eugene Marquardt, Covington, GA (US); John E. Sakmar, Atlanta, GA (US); Lucas Lee Leiner, Sugar Hill, GA (US); Jack Rains, Herndon, VA (US); Alfredo David Sanchez Morales, Brownsburg, IN (US); Charles Richard Shoop, Jr., Blythewood, SC (US)

(73) Assignee: ABL IP Holding LLC, Atlanta, GA (US)

( * ) Notice: Subject to any disclaimer, the term of this patent is extended or adjusted under 35 U.S.C. 154(b) by 286 days.

(21) Appl. No.: 18/117,101

(22) Filed: Mar. 3, 2023

(65) Prior Publication Data

US 2023/0284389 A1 Sep. 7, 2023

Related U.S. Application Data

(60) Provisional application No. 63/316,642, filed on Mar. 4, 2022, provisional application No. 63/316,605, filed on Mar. 4, 2022.

(51) Int. Cl.
H05K 1/18 (2006.01)
H05K 3/30 (2006.01)

(52) U.S. Cl.
CPC ............ *H05K 1/181* (2013.01); *H05K 3/305* (2013.01); *H05K 2201/10121* (2013.01)

(58) Field of Classification Search
CPC .......................................... H05K 1/185–1/188
See application file for complete search history.

(56) References Cited

U.S. PATENT DOCUMENTS

| 8,545,049 B2 | 10/2013 | Davis et al. |
| 9,052,070 B2 | 6/2015 | Davis et al. |
| 2010/0195330 A1 | 8/2010 | Schaefer et al. |
| 2016/0146440 A1* | 5/2016 | Jeong .................. H01L 25/0753 362/382 |

OTHER PUBLICATIONS

CA3,191,954, "Office Action", Sep. 10, 2024, 7 pages.

* cited by examiner

*Primary Examiner* — Jeremy C Norris
(74) *Attorney, Agent, or Firm* — Kilpatrick Townsend & Stockton LLP

(57) ABSTRACT

Embodiments are directed to optics, light modules with such optics, and methods of assembling such light modules such that the optics are attached and sealed directly to a printed circuit board, thereby eliminating the need for gaskets and a frame and reducing the number of component parts of the light module. In some embodiments, the optics are discrete optics that can each be attached to the printed circuit board independent of the other optics.

19 Claims, 11 Drawing Sheets

LIGHT MODULE WITH DISCRETE OPTICS AND METHODS OF ASSEMBLING SAME

CROSS-REFERENCE TO RELATED APPLICATIONS

This application claims the benefit of U.S. Provisional Application 63/316,642, filed Mar. 4, 2022, and U.S. Provisional Application No. 63/316,605, filed Mar. 4, 2022, the entire contents of both of which are incorporated herein in their entireties.

FIELD OF INVENTION

The present technology relates to light modules, and more particularly to light modules with optics attached directly to a printed circuit board, as well as methods for positioning, securing and sealing optics to a printed circuit board.

DESCRIPTION OF THE RELATED ART

Light modules with arrayed optics are used in various indoor and outdoor settings, which may include but are not limited to roadway lights or area lights. Typical light modules have a multi-part and complex construction. For example, they typically include (i) a printed circuit board (PCB) with light emitting diodes (LED) provided on the PCB in the desired number and array configuration, (ii) a lens that is positioned and attached over the PCB, (iii) one or more gaskets to seal the module against ingress of moisture and particulates that can damage the PCB and detrimentally impact operation of the LEDs, and (iv) a frame to hold such parts together. Optics are formed in the lens such that each optic will align with an LED when the light module is assembled. The lens (and associated optics) are typically molded from an optical grade polymeric material, such as polymethylmethacrylate (PMMA) or polycarbonate (PC). While such light modules are relatively easy to add like building blocks into a light fixture if additional lumens are needed, their multi-part, complex construction increases material costs, assembly time/costs, and the risk of product failure. There is a need for an improved method by which to attach optics to a printed circuit board.

BRIEF SUMMARY

The terms "invention," "the invention," "this invention" and "the present invention" used in this patent are intended to refer broadly to all of the subject matter of this patent and the patent claims below. Statements containing these terms should be understood not to limit the subject matter described herein or to limit the meaning or scope of the patent claims below. Embodiments of the invention covered by this patent are defined by the claims below, not this summary. This summary is a high-level overview of various aspects of the invention and introduces some of the concepts that are further described in the Detailed Description section below. This summary is not intended to identify key or essential features of the claimed subject matter, nor is it intended to be used in isolation to determine the scope of the claimed subject matter. The subject matter should be understood by reference to appropriate portions of the entire specification of this patent, any or all drawings and each claim.

Embodiments of the present disclosure are directed towards optics, light modules with such optics, and methods of assembling such light modules such that the optics are attached and sealed directly to a printed circuit board, thereby eliminating the need for gaskets and a frame and reducing the number of component parts of the light module.

BRIEF DESCRIPTION OF THE DRAWINGS

The disclosure will be readily understood by the following detailed description in conjunction with the accompanying drawings, wherein like reference numerals designate like structural elements, and in which.

DETAILED DESCRIPTION

Throughout this description for the purposes of explanation, numerous specific details are set forth in order to provide a thorough understanding of the many aspects and embodiments disclosed herein. It will be apparent, however, to one skilled in the art that the many aspects and embodiments may be practiced without some of these specific details. In other instances, known structures and devices are shown in diagram or schematic form to avoid obscuring the underlying principles of the described aspects and embodiments.

Described herein are discrete optics for light modules, and light modules incorporating such discrete optics. The discrete optics may be formed of any suitable material, including, but not limited to, silicone, glass, and optical grade plastic materials such as optical grade acrylics (e.g., optical grade polymethylmethacrylate (PMMA)) and optical grade polycarbonate (PC). The discrete optics may be located, secured, and sealed directly on the PCB, which may eliminate the need for a lens structure, gaskets, and a frame and thus reduce the number of component parts of the light module. The discrete optics also allow for improved customization of the light module as desired. As an example, optics having different distributions may be provided on a single PCB, and identical optics need not be used on the PCB. As a further example, the orientation of each optic on the PCB may be independently controlled, and the rotational orientation of the optics need not be the same. As yet another example, the shape and/or size of the PCB may be varied as required and may be provided with any number of light sources/optics, including a single light source/optic and/or a plurality of light sources/optics. Additionally or alternatively to light sources, a PCB may include one or more optical sensors. In such embodiments, the optical sensors may include a discrete optic. In such embodiments, the discrete optics may tailor the field of view and/or sensitivity of the sensor and/or filter out unwanted wavelengths of light. Discrete optics may be used with other types of light emitters as desired, including those that emit visible light, ultraviolet light, infrared light, etc. Various other benefits and advantages may be realized with the systems and methods provided herein, and the aforementioned advantages should not be considered limiting.

Figure 1:
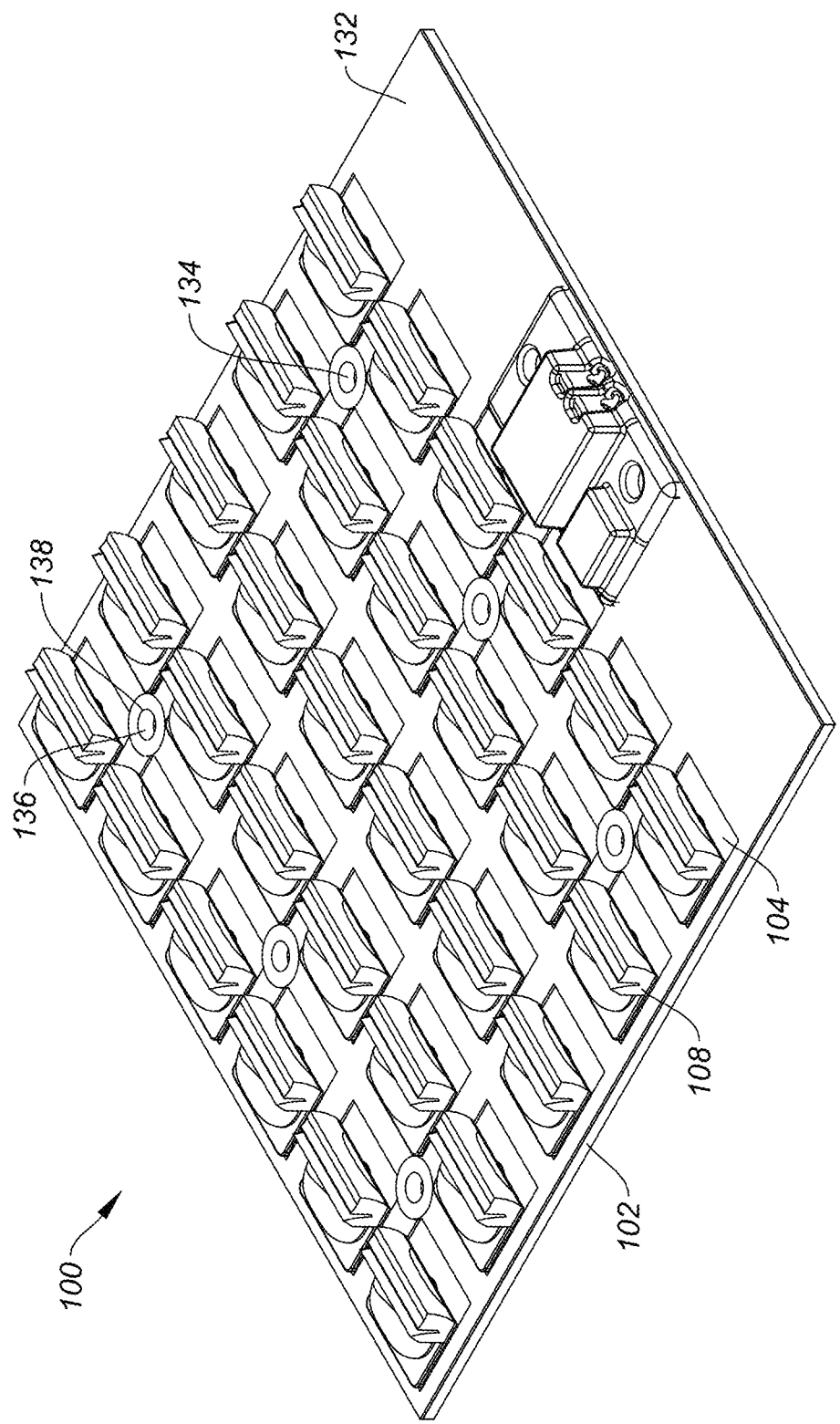
FIG. 1 is a perspective view of an embodiment of a light module.
Figure 2:
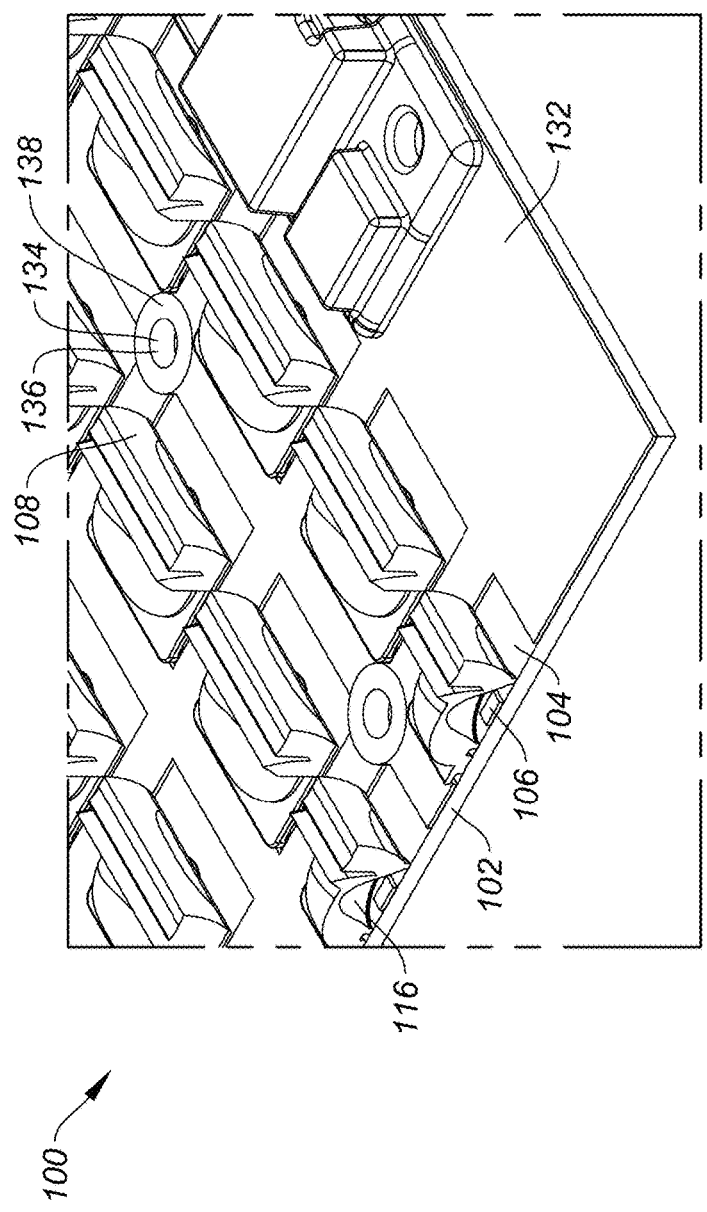
FIG. 2 is an enlarged perspective view of the light module of FIG. 1 shown in partial cross-section.
Figure 3:
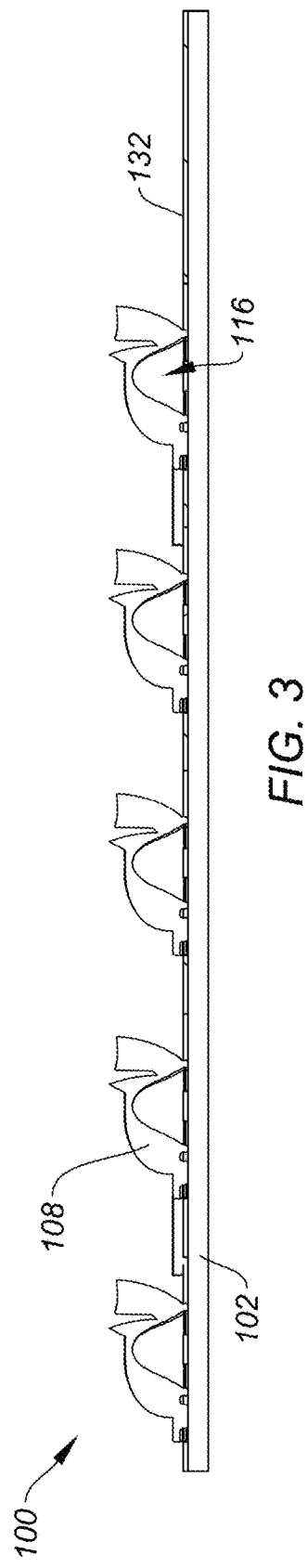
FIG. 3 is a cross-sectional view of a portion of the light module of FIG. 1.

FIGS. 1-3 illustrate a light module 100 according to embodiments. The light module 100 generally includes a PCB 102 with an upper surface 104 on which are provided one or more light sources 106. The one or more light sources 106 may include any suitable source of light, including but not limited to an LED, an OLED, an incandescent bulb, laser, combinations thereof, or other light sources as desired. Light sources are not limited to those providing visible light, but may also be light sources providing ultraviolet, infrared, and/or other light as desired. Moreover, any number, type, or arrangement of light sources 106 may be provided on the upper surface 104 as desired. In the embodiment illustrated in FIGS. 1-3, the light module 100 includes LEDs 106 as the light sources 106, and the LEDs are arranged in rows of six across the upper surface 104.

Discrete optics 108 are positioned on the upper surface 104, and each discrete optic 108 is positioned over a corresponding light source 106. While the optics 108 are illustrated as having the same rotational orientation in FIG. 1, in other embodiments the optics 108 may be provided at various rotational orientations as desired, and the rotational orientation of one optic 108 may be different from another optic 108. Moreover, while the optics 108 on PCB 102 are illustrated as having the same optical geometry, they need not in other embodiments.

Figure 5:
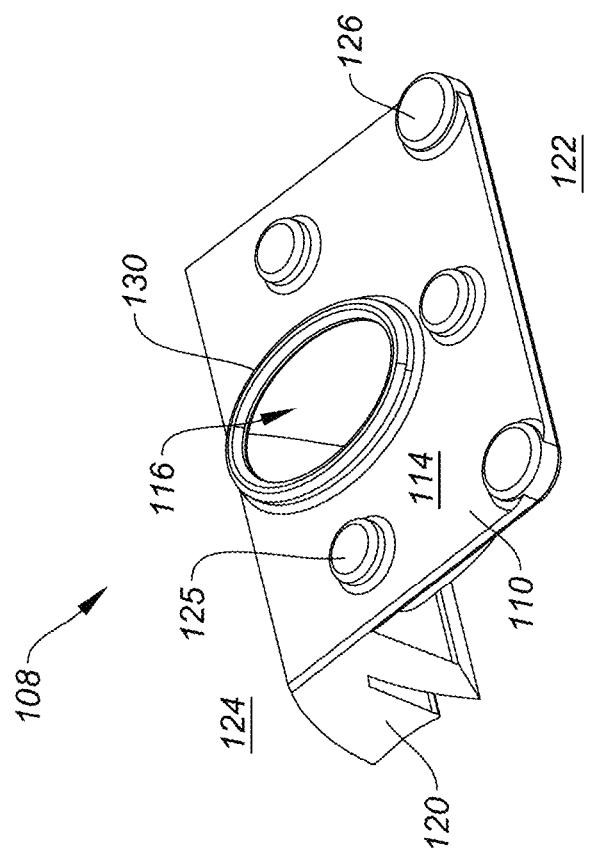
FIG. 5 is another perspective view of the embodiment of the optic of FIG. 4.
Figure 4:
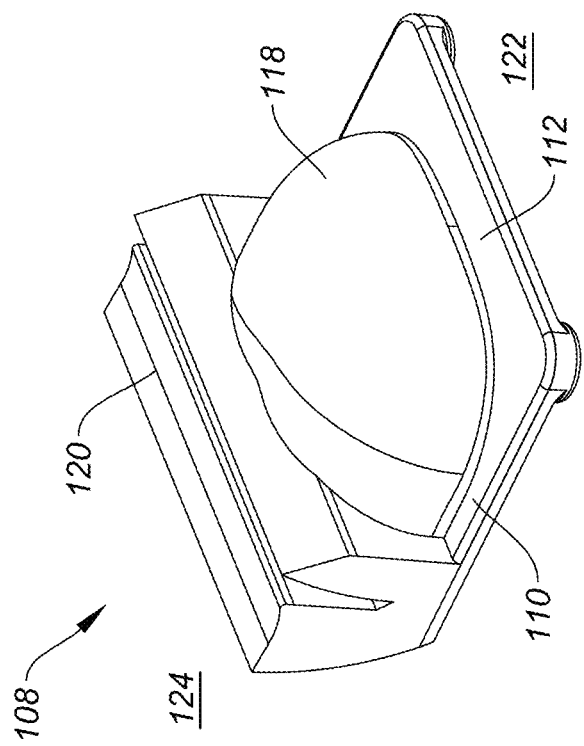
FIG. 4 is a perspective view of one embodiment of an optic.

FIGS. 4 and 5 illustrate an embodiment of a discrete optic 108, which may also be referred to herein as an optic 108 or optics 108. The discrete optic 108 may be formed of any suitable material, including, but not limited to silicone, glass, and optical grade plastic materials such as optical grade acrylics (e.g., optical grade polymethylmethacrylate) and optical grade polycarbonate). In some embodiments, the optics 108 contemplated herein are formed of an optical grade silicone. In some embodiments, the optics 108 optionally may be constructed from optical grade silicone materials with a refractive index of about 1.39 to about 1.43, inclusive. Additionally or alternatively, the optics 108 optionally may be constructed from optical grade silicone materials with a durometer in the range of 50-90 shore A. Non-limiting examples of optical grade silicone materials that may be suitable for the optics 108 may include silicone sold under the trade name SILASTIC™ MS-1002 Moldable Silicone by The Dow Chemical Company, silicone sold under the trade name SILASTIC™ MS-4002 Moldable Silicone by The Dow Chemical Company, or the silicone sold under the trade name SILOPREN™ LSR 7180 by Momentive Performance Materials Inc. However, as mentioned, in other embodiments, the optics 108 may be constructed from other materials as desired.

As illustrated in FIGS. 4 and 5, the optic 108 includes a base 110 having a first (or upper) surface 112 and a second (or lower) surface 114. The particular shape of the base 110 illustrated in FIGS. 4 and 5 should not be considered limiting, and base 110 may have any suitable shape. The second surface 114 includes an optical cavity 116, and in use, the optic 108 is positioned over a light source 106 such that the light source 106 emits light into the optical cavity 116. The optic 108, in turn, may refract, reflect, and/or otherwise alter the directionality of at least some of the emitted light such that light is emitted from the optic 108 in a desired pattern or distribution.

In the embodiment illustrated in FIGS. 4 and 5, the optic 108 includes a first side 122 having a first portion 118 of the optic 108 and a second side 124 having a second portion 120 of the optic 108. The first portion 118 and the second portion 120 may be integrally formed or formed separately and subsequently attached to each other. The first portion 118 (which can include the optical cavity 116) is generally designed to receive light rays from the light source 106 and/or refract or otherwise emit the light rays in a direction toward the first side 122 of the optic 108. The second portion 120 may be designed to reflect and refract light that is initially emitted from the light source 106 toward the second side 124 of the optic 108 back toward the first side 122 of the optic 108. In the illustrated embodiment, the second portion 120 may include one or more total internal reflection surfaces that reflect light rays and direct them out of the second portion 120 of the optic 108 and toward the first side 122 of the optic 108. Again, however, optics 108 may have any geometry and are not limited to the specific geometry shown in FIGS. 4 and 5 (or FIGS. 1-3). Optical geometries taught in U.S. patent application Ser. No. 17/686,785, filed Mar. 4, 2022 and entitled Optic with Total Internal Reflection Refractor for Back Light Control, the entirety of which is incorporated herein by reference, may be suitable in some applications.

Figure 15:
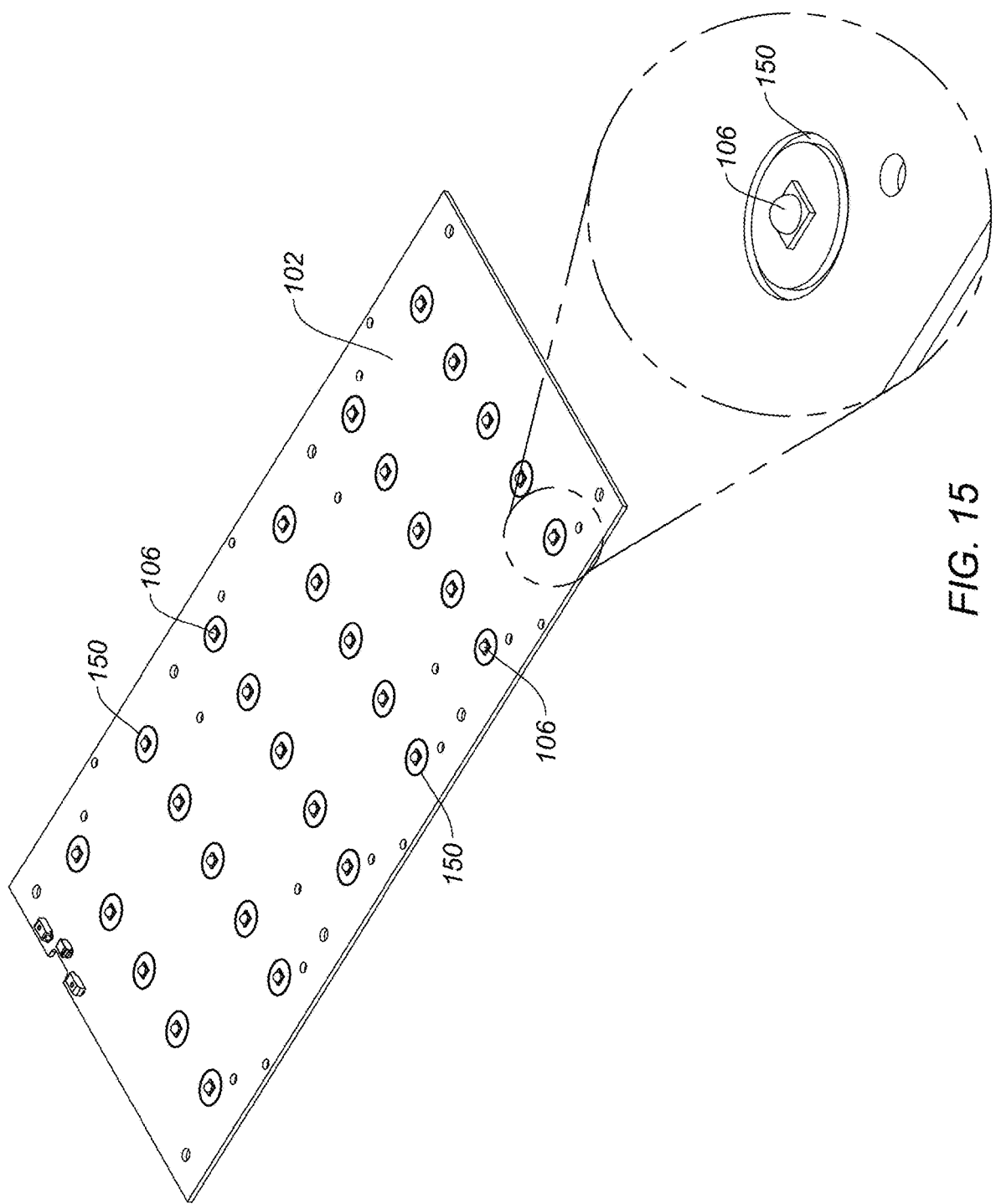
FIG. 15 is a perspective view of an embodiment of a printed circuit board on which the optic of FIGS. 4 and 5 may be positioned.

In certain embodiments and as best illustrated in FIG. 5, a wall 130 may extend from or otherwise be provided on the second surface 114 of the base 110. In various embodiments, the wall 130 may encircle at least the optical cavity 116 such that when the optic 108 is assembled with the PCB 102, the wall 130 contacts the upper surface 104 of the PCB 102. In some non-limiting embodiments, one or more grooves are provided in the upper surface 104 that match the shape of the wall 130. For example, FIG. 15 illustrates an embodiment of a PCB 102 that includes a groove 150 having a shape that matches that of wall 130. In this way, the wall 130 is received within the groove 150 when optic 108 is assembled with the PCB 102. Regardless, contact between the wall 130 and the PCB 102 may at least partially seal the optical cavity 116. Such sealing may provide one or more benefits, such as preventing moisture and particulates from reaching the light source 106 positioned within the optical cavity 116 and/or helping to prevent an adhesive used to join the optic 108 with the PCB 102 from entering the optical cavity 116 and reaching the light source 106. In the embodiment illustrated, the wall 130 encircles the opening (not labeled) of optical cavity 116 while other portions of the second surface 114 are outside of the wall 130. In other embodiments, the wall 130 may have other shapes or profiles as desired. For example, the wall 130 (and/or an additional wall) may be provided along a perimeter of the base 110 instead of or in addition to a wall encircling the opening of optical cavity 116 (see, e.g., FIG. 11, discussed in detail below).

Figure 8:
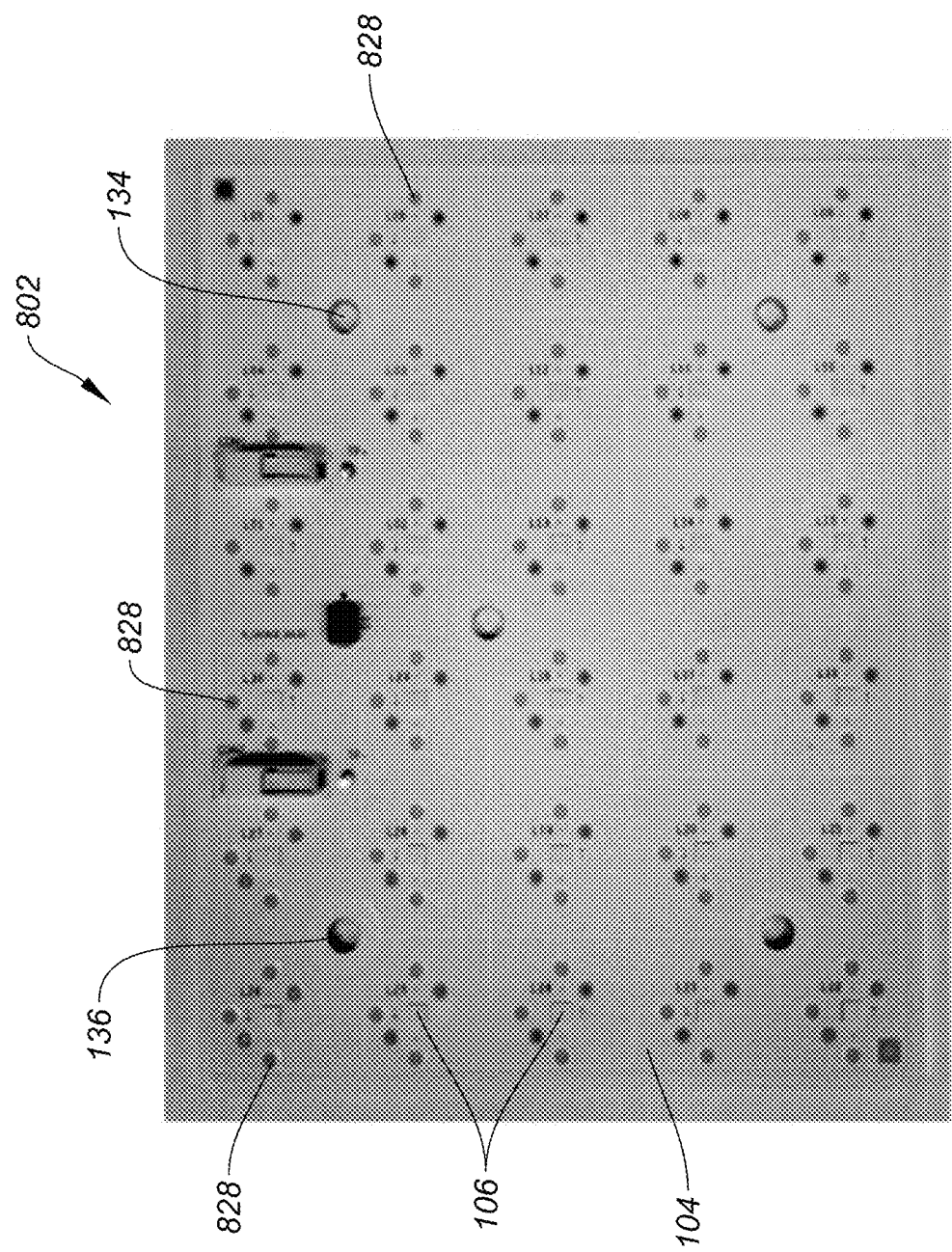
FIG. 8 is a plan view of an embodiment of a printed circuit board.

In some embodiments and as best illustrated in FIG. 5, one or more stand-offs 125 may extend from or otherwise be provided on the second surface 114 of the base 110. The stand-offs 125 may contact the upper surface 104 of the PCB 102 when the optic 108 is assembled with the PCB 102. In certain embodiments, one or more stand-offs 125 may be orienting features 126, which may be used to facilitate assembly of the optic 108 with the PCB 102 (as described in more detail below). However, in other embodiments, the orienting features 126 may be other structures or mechanisms on the base 110 in addition to or in place of the stand-offs 125. In the embodiment illustrated, the orienting features 126 are provided on the second surface 114 of the base 110, and the orienting features 126 are the stand-offs 125. As mentioned, in other embodiments, other types of orienting features and/or combinations of orienting features may be used and/or at various locations on the base 110 as desired. In certain embodiments, the one or more orienting features 126 may be provided at predetermined locations on the base 110 and/or may form a predetermined pattern on the base 110. During assembly of the optic 108 with the PCB 102, a user and/or automated equipment (e.g., pick and place machinery) may determine the orientation of the optic 108 based on the detection and/or identification of the orienting features 126 (e.g., using machine vision) and may position the optic 108 such that the optic 108 has a desired orientation. In some embodiments, the PCB 102 optionally may include complimentary orienting features, and the optic 108 may be assembled with the PCB 102 by aligning the orienting features 126 with the orienting features on the PCB 102. For example, FIG. 8 illustrates a PCB 802 with light sources 106 and orienting features 828 provided adjacent to each light source 106. In this embodiment, orienting features on the optic may be aligned with the orienting features 828 on the PCB 802 when assembling the optic with the PCB 802.

The discrete optics 108 are assembled with the PCB 102 by positioning each optic 108 over a corresponding light source 106. In various aspects, the orienting features 126 and the wall 130 may contact the upper surface 104, and the remaining portion of the second surface 114 may be elevated above the upper surface 104. In other embodiments, grooves or other depressions may be provided in the upper surface 104 and sized and shaped to receive features extending from the second surface 114 of base 110 (e.g., stand-offs 125, orienting features 126, and/or wall 130). When so received, the second surface of base 110 may be substantially flush with the upper surface 104 of the PCB 102.

The discrete optics 108 may be attached to the upper surface 104 of PCB 102 using various techniques as desired. In some embodiments, an adhesive may be used to adhere one or more of the discrete optics 108 to the PCB 102. In such embodiments, any suitable adhesive may be used to secure the optics 108 to the PCB 102. Non-limiting examples of suitable adhesives may include, but are not limited to those sold under the trade names of LOCTITE® SI 5055 by Henkel (https://www.henkel-northamerica.com/brands-and-businesses/adhesive-technologies), LOCTITE® SI 5056 by Henkel, DOWSIL™ 3140 RTV Coating by The Dow Chemical Company, DOWSIL™ 3145 RTV Mil-A-46446 Adhesive/Sealant by The Dow Chemical Company, and DOWSIL™ SE 9187 L Adhesive by The Dow Chemical Company.

While adhesive may be dispensed generally to surround the LED such that less precision is required both in adhesive application and optic placement, it may be desirable to exercise control over the location and/or amount of adhesive that is applied to the PCB. For example, in embodiments, control over the location and/or amount of adhesive is exercised such that the adhesive does not encroach upon the LEDs and interfere with their operation. For example, a desired amount of adhesive may be dispensed onto the PCB at locations and in shapes that will align or register with those stand-offs/walls when the optic is oriented and positioned on the PCB as desired. In various embodiments, the adhesive may be provided on the optic 108 (e.g., on the stand-offs 125, orienting features 126 and/or wall 130) and/or on corresponding locations on the PCB 102.

After the discrete optic(s) 108 has/have been adhered to the PCB 102, a conformal coating 132 is applied to upper surface 104 of PCB 102. The conformal coating 132 extends on upper surface 104 of the PCB 102 and around the discrete optics 108. In some embodiments, the conformal coating 132 may extend under the discrete optics 108. The conformal coating 132 can serve to seal the edge of the optics 108 to prevent moisture and particulates from reaching the light sources 106 positioned within the optical cavities 116 of the discrete optics 108, to electrically insulate the PCB 102, and/or to protect electronic circuits on the PCB 102 from harsh environments that may contain moisture and contaminants that can corrode the electronics.

Any suitable conformal coating material that realizes one or more of these benefits may be used as or in the conformal coating 132. In some embodiments, the conformal coating 132 is formed from a silicone-based material. Non-limiting examples of silicone-based materials that can be used as the conformal coating material include those materials sold under the trade name of DOWSIL™ 3-1953 Conformal Coating by The Dow Chemical Company or LOCTITE® SI 5293 by Henkel. In embodiments where one or more optics 108 are formed from silicone, the silicone material used to form the conformal coating 132 may be the same or different from the material used to form the optic 108.

The conformal coating material may be applied at a prescribed thickness to extend on all or a portion of the exposed upper surface 104 of the PCB 102 and around some or all of the optics 108, as shown in FIG. 1. In some embodiments, the optic 108 is provided on the upper surface 104 such that the second surface 114 of the base 110 is offset from the upper surface 104 and may allow for the conformal coating 132 to be at least partially provided between the upper surface 104 and the second surface 114 of each optic 108.

The PCB 102 may include one or more attachment features 134 that allow the light module 100 to be directly attached to a light fixture without requiring additional gaskets, frames, etc. In the embodiment illustrated, the PCB 102 includes apertures 136 that may receive mechanical fasteners (e.g., bolts, screws, etc.) for securing the light module 100 to a light fixture. In this embodiment, bushings 138 may be included to protect the light module 100 from the mechanical fasteners. In other embodiments, other attachment features 134 may be utilized as desired, including snap-fit connectors, hooks, pins, clips, clasps, adhesives, combinations thereof, and/or other attachment features as desired.

In some embodiments, one or more sensors may optionally be included. As examples, optical sensors may be included with light modules provided herein. In such examples, the optics 108 may be provided with such optical sensors to improve and/or tailor performance of the sensors. As an example, an optic 108 may tailor an optical sensor's field of view and/or sensitivity to a specific area. Additionally or alternatively, the optic provided on a sensor may filter out unwanted wavelengths and/or provide other performance control as desired.

Figure 6:
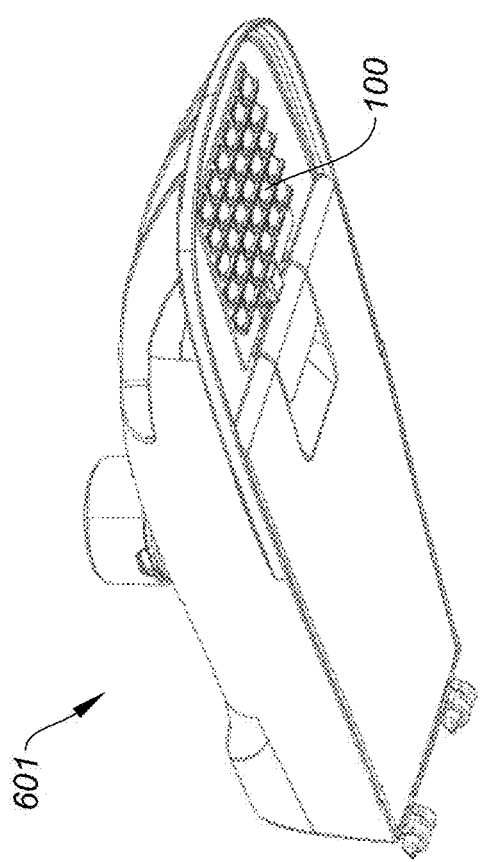
FIG. 6 is a perspective view a light fixture with the light module of FIG. 1 incorporated therein.
Figure 7:
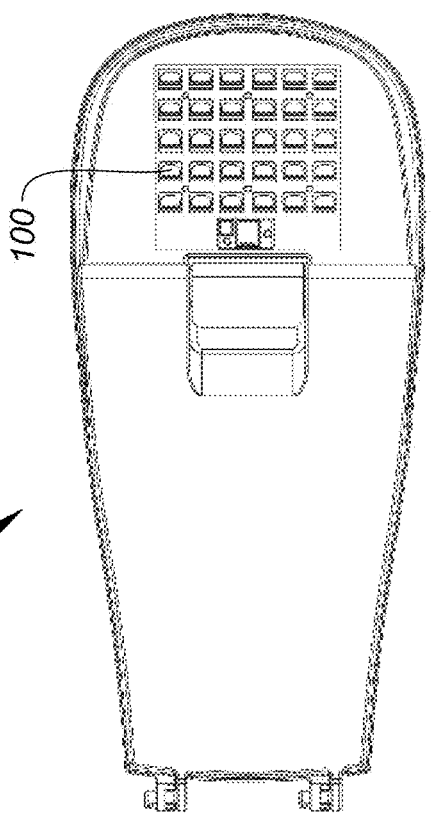
FIG. 7 is a plan view of the light fixture of FIG. 6.

FIGS. 6 and 7 illustrate an example of a light fixture 601 with the light module 100.

Figure 9:
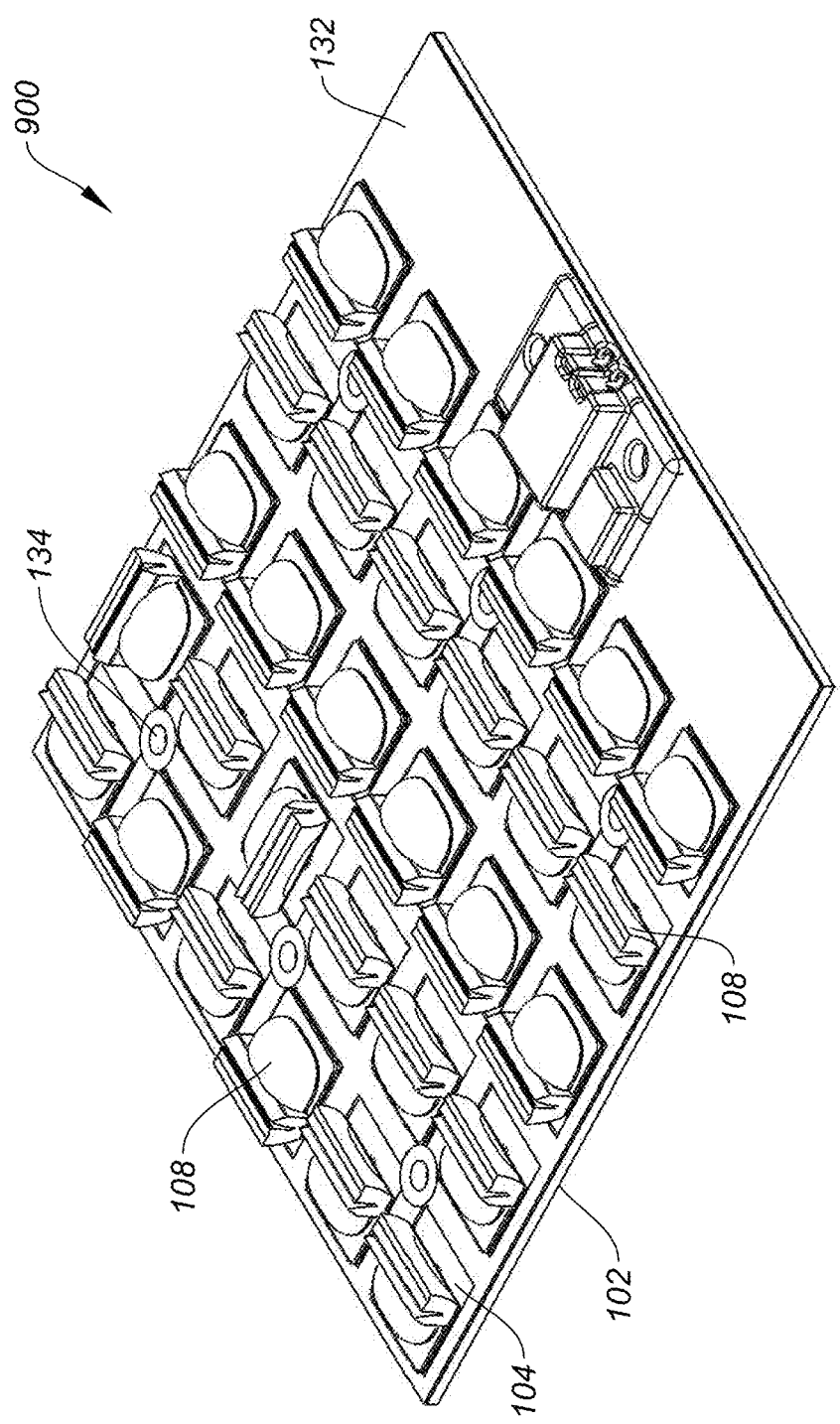
FIG. 9 is a perspective view of another embodiment of a light module.

FIG. 9 illustrates another example of a light module 900. The light module 900 is substantially similar to the light module 100 except that the rotational orientations of the optics 108 is not uniform.

Figure 10:
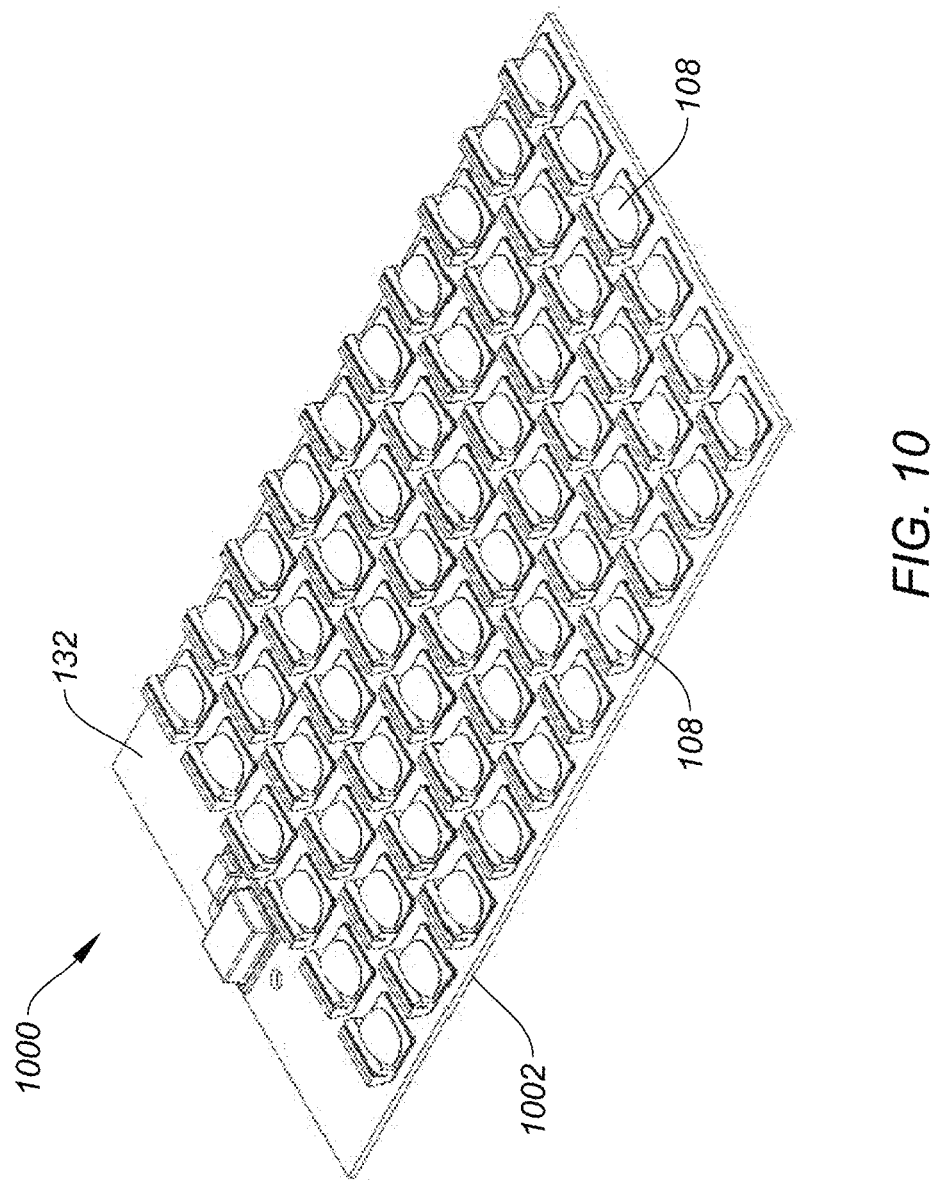
FIG. 10 is a perspective view of yet another embodiment of a light module.

FIG. 10 illustrates another example of a light module 1000 that is substantially similar to the light module 100 except that the light module 1000 includes a larger PCB 1002 accommodating additional optics 108.

Figure 11:
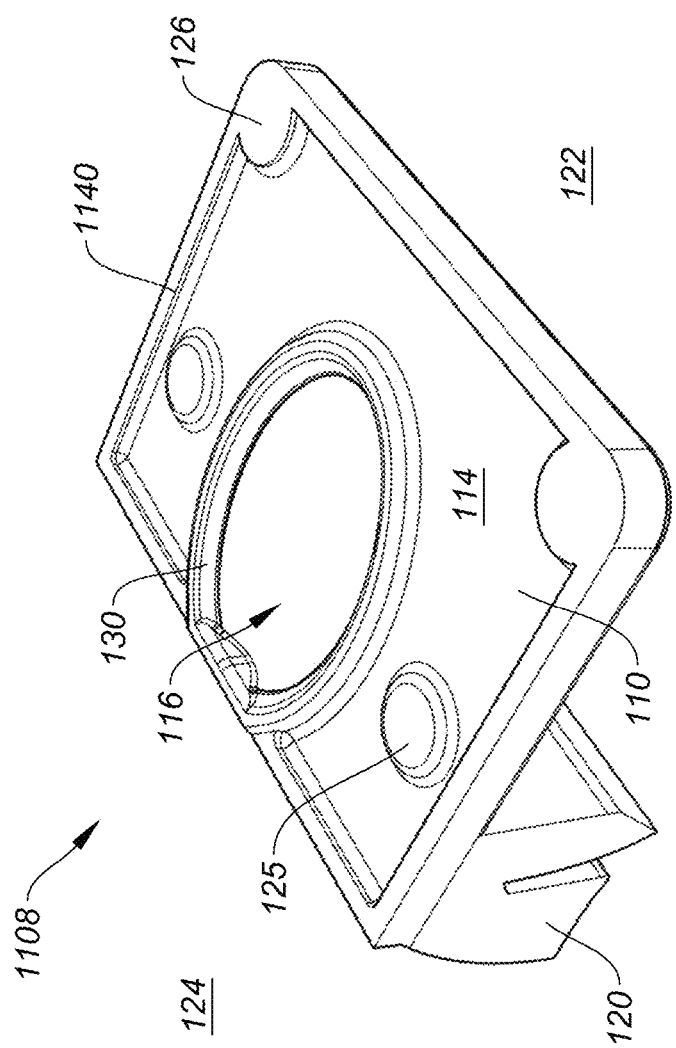
FIG. 11 is a perspective view of another embodiment of an optic.

FIG. 11 illustrates another example of an optic 1108 according to embodiments. The optic 1108 is substantially similar to the optic 108 except that the optic 1108 additionally includes a wall 1140 that extends along a perimeter of the base 110 of the optic 1108. When assembled with a PCB, the wall 1140 may contact the PCB. The shape and size of the wall 1140 should not be considered limiting. Moreover, in other embodiments, the wall 1140 need not be along the perimeter. Regardless, contact between the wall 1140 and the PCB may further at least partially seal the optical cavity 116 and/or portions of the second surface 114 of the base 110. In some embodiments, the wall 1140 may provide additional locations for the conformal coating to adhere to, which may further improve sealing of the optic 1108 and/or positioning of the optic 1108.

Referring back to FIGS. 1-3, a method of assembling the light module 100 may include providing the PCB 102 with the plurality of light sources 106. In various embodiments, the method includes providing LEDs as the plurality of light sources 106. The method includes attaching each discrete optic 108 to the PCB 102 such that the optic 108 covers a corresponding light source 106. In some embodiments, the method may include controlling an orientation of the optic 108 relative to the PCB 102 using the orienting features 126 while attaching the optics 108 to the PCB 102. In certain embodiments, attaching the optics 108 to the PCB 102 may include using an adhesive to attach the optics 108 to the PCB 102. The method may include providing a conformal coating 132 on the upper surface 104 of the PCB 102 such that the conformal coating 132 at least partially covers the upper surface 104 and is provided around the optics 108. Of note is that embodiments of methods of assembling the light module 100 may not include providing a frame or a gasket around the light module 100 as such components are not required with embodiments of the light module 100. The method may include assembling the light module 100 with a light fixture using one or more attachment features 134.

Additional embodiments are directed to manufacturing methods for strategically locating, securing and sealing discrete optics on a PCB. Embodiments of the manufacturing methods are described for forming the light modules described above, but such methods could be used to form any other light modules whereby discrete optics are secured to a PCB.

Use of discrete optics that are untethered to the other optics on the PCB injects multiple degrees of freedom into the light module design. For example, identical optics need not be used on the PCB. Rather, optics having different distributions can be provided on a single PCB. Moreover, the rotational orientation of the optics need not be aligned; rather, each optic enjoys rotational freedom and can be rotationally oriented independent from the other optics on the PCB. In this way, the overall light distribution of the light fixture can be tailored for particular applications. Embodiments of the methods contemplated herein enable creation of customized light modules and steps of the method may be controlled (typically via software) to effectuate creation of such light modules.

Figure 12:
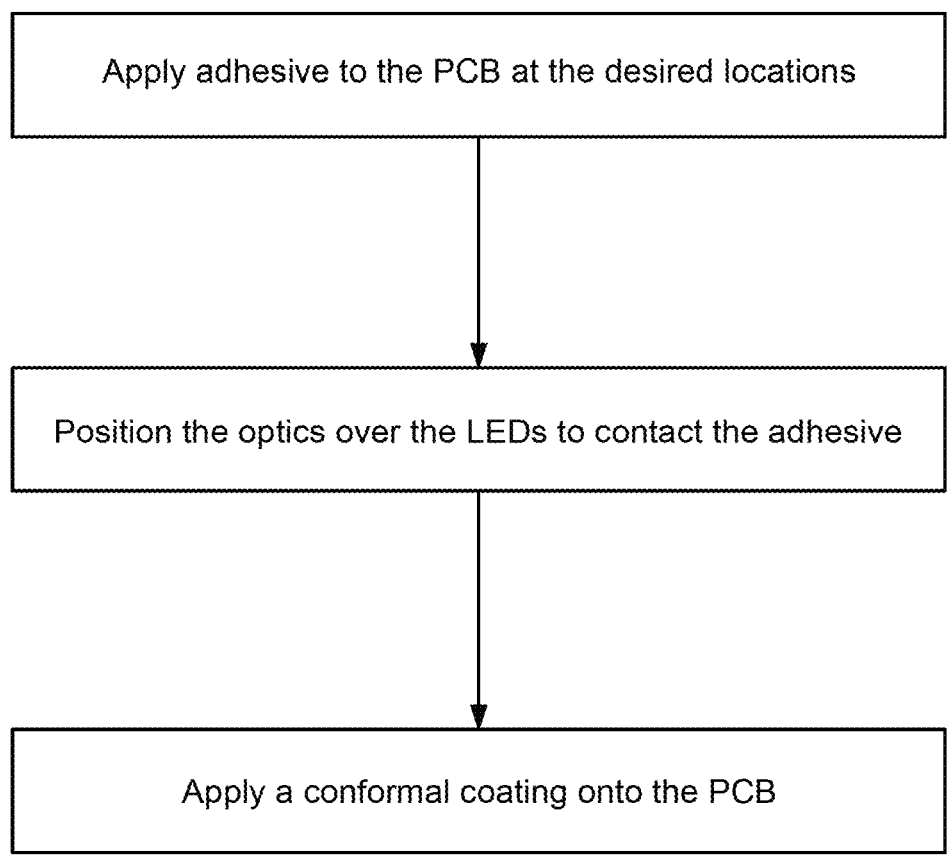
FIG. 12 is a flow diagram of one embodiment of a method for assembling the light module of FIG. 1.

FIG. 12 illustrates the general steps of one embodiment of the method. In Block 1, adhesive is applied to a PCB populated with LEDs. The adhesive is applied at desired locations for securing discrete optics to the PCB. In Block 2, the discrete optics are positioned over their respective LED so as to contact the adhesive. In Block 3, a conformal coating is applied onto the PCB and around (e.g., each of) the discrete optics to seal the optical cavity thereof. Each of the broad steps of FIG. 1, as well as some of the more detailed steps shown FIG. 2, is described in more detail below. While some or all of these steps are described as automated, it should be understood that they can also be performed by hand.

Adhesive Application

An adhesive may be applied to the upper surface 104 of the PCB 102 populated with one or more light sources 106 (e.g., LEDs). The adhesive serves to adhere one or more optics 108 to the PCB 102, as described below. Application of the adhesive to the PCB 102 may be performed in any suitable manner, such as by hand and/or with a machine. In some embodiments, an adhesive dispensing machine (e.g., a jet dispensing machine) is used to dispense adhesive onto the PCB 102 at strategic locations for subsequent engagement with one or more optics 108. Non-limiting examples of suitable adhesive dispensing machines that can be used include those available from Mycronic (https://www.mycronic.com/en/), such as, but not limited to, machines available in Mycronic's MYSmart series (https://www.mycronic.com/en/products/dispensing-coating/). Regardless of the machine selected, in some embodiments it can be programmed to control the location, shape, and amount of adhesive it dispenses onto the PCB 102.

While adhesive may be dispensed generally to surround the LED such that less precision is required both in adhesive application and optic placement, it may be desirable to exercise control over the location and/or amount of adhesive that is applied to the PCB. For example, in embodiments, control over the location and/or amount of adhesive is exercised such that the adhesive does not encroach upon the LEDs and interfere with their operation.

As described above, an optic 108 may be provided with one or more discrete stand-offs 125 and/or walls 130, 1140 extending from the second surface 114 of the base 110 of the optic 108 (see FIGS. 5 and 11). The adhesive dispensing machine can be programmed to dispense onto the PCB 102 a desired amount of adhesive at locations and in shapes that will align or register with those stand-offs/walls when the optic 108 is oriented and positioned on the PCB 102 as desired.

Any suitable adhesive may be used to secure the optics 108 to the PCB 102. In one embodiment, a silicone-based adhesive is used, such as (but not limited to) Loctite SI 5055 (https://www.henkel-adhesives.com/us/en/product/uv-curing-adhesives/loctite_si_5055.html) or Loctite SI 5056 (https://www.henkel-adhesives com/us/en/product/ny-coring-adhesives/loctite_si_5056.html), both available from Henkel (https://www.henkel-northamerica.com/brands-and-businesses/adhesive-technologies). Adhesives available from Dow, such as Dowsil 3140 (https://www.dow.com/en-us/pdp.dowsil-3140-rty-coating_01015788z.html), Dowsil 3145 (https://www.dow.com/en-us/pdp.dowsil-3145-ntv-mil-a-46146-adhesive-sealant.01059548z.html), and Dowsil SE 9187 (https://www.dow.com/en-us/pdp.dowsil-se.9187-1-adhesive.02511991z html) may also be suitable.

In some embodiments, the method also includes an adhesive inspection step to ensure that the correct amount and/or shape of adhesive has been applied to the PCB 102 at the correct locations on the PCB 102. Performance of the adhesive inspection step may be performed manually or via a machine. Without limitation, in embodiments adhesive inspection is performed with an adhesive inspection machine. One example of such machine is the Neptune C+ (https://www.kohyoung.com/en/product/detail/DispensingProcessInspection/NeptuneC), available from Koh Young (https://www.kohyoung.com/en).

Optic Mounting

Once the adhesive has been provided on the PCB 102, one or more discrete optics 108 may be secured to the PCB 102. This step may be performed by "Pick and Place Equipment" designed to pick-up an optic 108 and place that optic 108 on the PCB 102 at a desired location and at a desired rotational orientation. The equipment repeats this process until the PCB 102 is populated with the desired number of optics 108. The number of discrete optics 108 is not limited, and in general may correspond to the number of LEDs on the PCB 102. Various types of pick and place machines are known and are suitable for this purpose. Non-limiting examples of suitable pick and place machines that can be used include those in the Fuzion product line (https://www.uic.com/products-surface-mount/) by Universal Instruments (https://www.uic.com/), such as but not limited to the Fuzion2-14.

Figure 13:
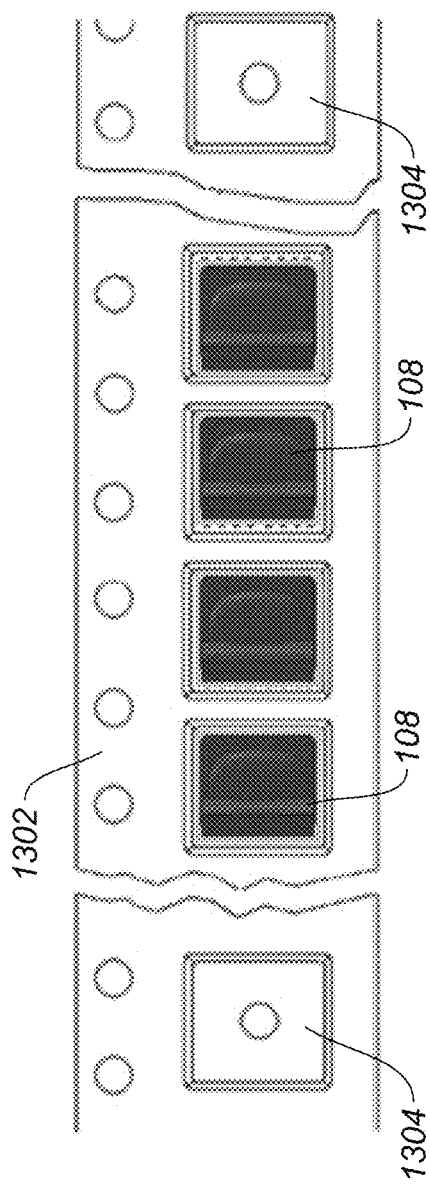
FIG. 13 is a plan view of an embodiment of a carrier for supporting optics during assembly.
Figure 14:
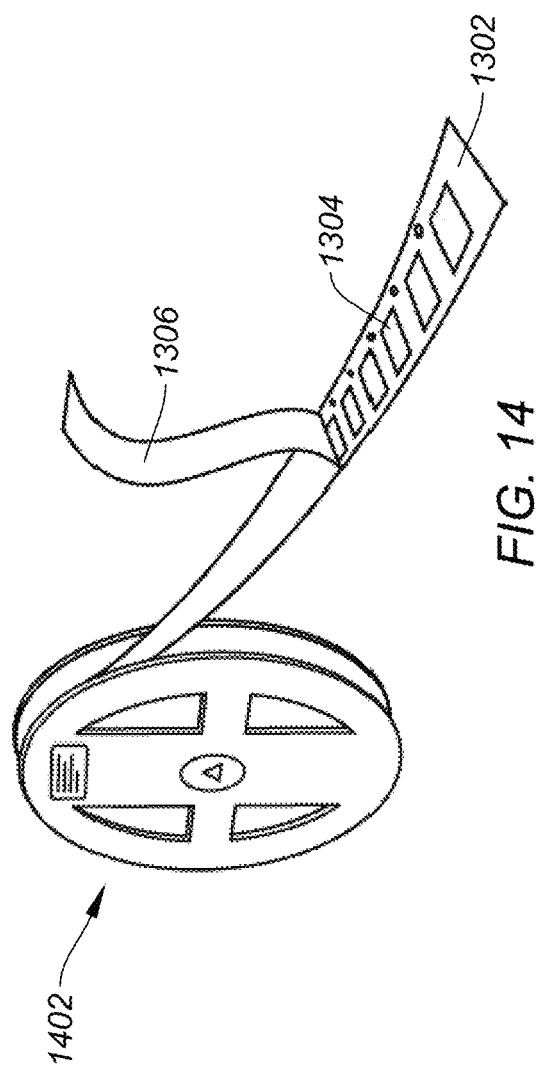
FIG. 14. is a perspective view of the carrier of FIG. 13 provided on a reel.

In one non-limiting embodiment (see FIG. 13), the optics 108 are supported on a carrier 1302 provided with discrete pockets or cavities 1304. Each cavity 1304 receives an optic 108. In some embodiments, the orientation of all or some of the optics 108 within the cavities 1304 on the carrier 1302 is the same. A cover member 1306 can optionally extend on top of the carrier 1302 and over the cavities 1304 to help retain the optics 108 within the cavities 1304. In some embodiments, the carrier 1302 is provided on a reel 1402 (see FIG. 14). In use, the carrier 1302 is unwound from the reel 1402 and the optional cover member 1306 is removed to expose the optics 108 in the cavities 1304 for pick-up (such as by pick-up nozzles).

In general, the pick and place equipment will include one or more pick-up nozzles designed to support a discrete optic 108. In some embodiments, the pick-up nozzle(s) may be customized for optics with different geometries. In other embodiments, the pick-up nozzles may be used universally with any optic.

In some embodiments, the nozzle includes one or more arms that engage the optic 108 and retain it on the nozzle via suction. A nozzle carries an optic 108 to its assigned position on the PCB 102 (as may be delineated by x and y coordinates or any other placement scheme) and ensures proper rotational orientation of the optic 108 relative to the PCB 102 using machine vision. More specifically and by way of example, a camera may be provided in the equipment that is programmed to detect one or more features on the optic (e.g., the corner stand-offs 125 in FIGS. 5 and 11) and use that information to rotationally orient and center the optic 108 over the LED 106. In some embodiments, the nozzle is rotatable about its longitudinal/vertical axis to facilitate this process.

After the PCB 102 has been populated with the optic(s) 108, the adhesive is dried or cured (depending on the type of adhesive) to adhere the optics to the PCB. While drying and/or curing may occur at room temperature, in other embodiments the adhesive is dried and/or cured in an oven, such as an ultraviolet (UV) curing oven.

Conformal Coating

After the discrete optic(s) 108 has/have been adhered to the PCB 102, the conformal coating 132 is applied to the PCB 102. The conformal coating 132 extends on the upper surface 104 of the PCB 102 and around the optics 108. In some embodiments, the conformal coating 132 may extend under the optic 108. The conformal coating 132 can serve to seal the edge of the optics 108 to prevent moisture and particulates from reaching the LEDs 106 positioned within the optical cavities 116 of the optics 108, to electrically insulate the PCB 102, and/or to protect electronic circuits on the PCB 102 from harsh environments that may contain moisture and contaminants that can corrode the electronics.

Any suitable conformal coating material that realizes one or more of these benefits may be used as or in the conformal coating 132. In one embodiment, the conformal coating 132 is formed from a silicone-based material. Non-limiting examples of silicone-based materials that can be used as the conformal coating material include Dowsil 3-1953 (https://www.dow.com/en-us/pdp.dowsil-3.1953-conformal-coating.04000066z.html), available from Dow, and Loctite SI 5293 (https://www.henkel-adhesives.com/us/en/product/conformal-coatings/loctite_si_5293.html), available from Henkel. A non-limiting example of a suitable coating machine that can be used to apply the conformal coating to the PCB is the Delta 6 machine available from PVA (https://www.pva.net/products/delta-6/).

The conformal coating material may be applied at a prescribed thickness to extend on all or a portion of the exposed upper surface 104 of the PCB 102 and around some or all of the optics 108, as shown in FIG. 1. Following application of the conformal coating material to the PCB 102, it may be dried and/or cured to form the conformal coating 132. Whether the conformal coating material is dried or cured may depend on the type of conformal coating material used. In one embodiment, the conformal coating material is dried or cured in an oven, such as, but not limited to, a Triotek oven (https://etsmax.com/heat-curing-ovens-cure-oven-thermal-curing-ovens-cure-oven-ir-infrared-in-line-conveyor-curing-ovens-cure-oven/) available from ETS Inc. (https://etsmax.com/), to form the conformal coating 132.

The various aspects, embodiments, implementations or features of the described embodiments can be used separately or in any combination. In particular, it should be appreciated that the various elements of concepts from the figures may be combined without departing from the spirit or scope of the invention.

The use of the terms "a" and "an" and "the" and similar referents in the context of describing the invention (especially in the context of the following claims) are to be construed to cover both the singular and the plural, unless otherwise indicated herein or clearly contradicted by context. Directional references such as "up," "down," "top," "bottom," "left," "right," "front," and "back," among others, are intended to refer to the orientation as illustrated and described in the figure (or figures) to which the components and directions are referencing. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, or gradients thereof, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate embodiments of the invention and does not pose a limitation on the scope of the invention unless otherwise claimed. No language in the specification should be construed as indicating any non-claimed element as essential to the practice of the invention.

As used herein, the term "substantially" refers to the complete or nearly complete extent or degree of an action, characteristic, property, state, structure, item, or result. For example, an object that is "substantially" enclosed would mean that the object is either completely enclosed or nearly completely enclosed. The exact allowable degree of deviation from absolute completeness may in some cases depend on the specific context. However, the nearness of completion will be so as to have the same overall result as if absolute and total completion were obtained.

Preferred embodiments of this invention are described herein, including the best mode known to the inventors for carrying out the invention. The invention is susceptible to various modifications and alternative constructions, and certain shown exemplary embodiments thereof are shown in the drawings and have been described above in detail. Variations of those preferred embodiments, within the spirit of the present invention, may become apparent to those of ordinary skill in the art upon reading the foregoing description. The inventors expect skilled artisans to employ such variations as appropriate, and the inventors intend for the invention to be practiced otherwise than as specifically described herein. Accordingly, it should be understood that there is no intention to limit the invention to the specific form or forms disclosed, but on the contrary, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of specific embodiments are presented for purposes of illustration and description. They are not intended to be exhaustive or to limit the described embodiments to the precise forms disclosed. It will be apparent to one of ordinary skill in the art that many modifications and variations are possible in view of the above teachings.

What is claimed is:

1. A light module comprising:
a printed circuit board comprising at least one light source provided on an upper surface of the printed circuit board, wherein the printed circuit board comprises at least one board orienting feature; and
an optic adhered directly to the upper surface of the printed circuit board and over the at least one light source, wherein the optic comprises at least one optic orienting feature and wherein the at least one optic orienting feature comprises a stand-off extending from the optic,
wherein the optic is adhered to the upper surface of the printed circuit board so that the at least one optic orienting feature is located at a predetermined position relative to the at least one board orienting feature.

2. The light module of claim 1, wherein the optic comprises a base having a lower surface, an optical cavity having a cavity opening in the lower surface of the base, and a wall that extends outwardly from the lower surface of the base, wherein the at least one light source is positioned to emit light into the optical cavity and wherein the wall engages the upper surface of the printed circuit board.

3. The light module of claim 2, wherein the wall extends at least partially around the cavity opening.

4. The light module of claim 3, wherein the wall extends entirely around the cavity opening.

5. The light module of claim 2, wherein the upper surface of the printed circuit board comprises at least one groove that receives the wall.

6. The light module of claim 5, wherein the groove and wall each comprises a shape and wherein the shape of the groove substantially matches the shape of the wall.

7. The light module of claim 1, further comprising a conformal coating on the upper surface of the printed circuit board, wherein the conformal coating at least partially surrounds the optic.

8. The light module of claim 1, wherein the optic comprises a plurality of optics and the at least one light source comprises a plurality of light sources, wherein each of the plurality of optics is positioned over a single one of the plurality of light sources.

9. The light module of claim 1, wherein the optic comprises a plurality of optics and wherein at least some of the plurality of optics are adhered to the upper surface of the printed circuit board in different rotational orientations.

10. The light module of claim 1, wherein the optic comprises a plurality of optics and wherein at least some of the plurality of optics are different.

11. The light module of claim 1, wherein the at least one light source comprises at least one array of light sources.

12. An optic comprising:
a base having a lower surface,
at least one optical cavity having a cavity opening in the lower surface of the base, and
a wall that extends outwardly from the lower surface of the base and at least partially around the cavity opening, wherein the at least one optical cavity is configured to extend over a light source provided on a printed circuit board such that the wall engages an upper surface of the printed circuit board,
wherein the wall is configured to seat within a groove provided on the upper surface of the printed circuit board.

13. The optic of claim 12, wherein the wall extends entirely around the cavity opening and is configured to seal the at least one optical cavity when the wall engages the upper surface of the printed circuit board.

14. The optic of claim 12, wherein the groove and wall each comprises a shape and wherein the shape of the groove substantially matches the shape of the wall.

15. A method of assembling a light module comprising an optic having a base and a printed circuit board having at least one light source on an upper surface of the printed circuit board, the method comprising:
adhering the base of the optic to the upper surface of the printed circuit board such that the optic is positioned over the at least one light source, wherein the upper surface of the printed circuit board comprises at least one groove that receives a wall extending from the base of the optic.

16. The method of claim 15, wherein the base of the optic comprises a lower surface, an optical cavity having a cavity opening in the lower surface of the base, and the wall that extends outwardly from the lower surface of the base, wherein adhering the base of the optic to the upper surface of the printed circuit board such that the optic is positioned over the at least one light source comprises:

adhering the base of the optic to the upper surface of the printed circuit board such that the at least one light source emits light into the optical cavity and the wall engages the upper surface of the printed circuit board to seal the optical cavity.

17. A light module comprising:

a printed circuit board comprising at least one light source provided on an upper surface of the printed circuit board; and an optic adhered directly to the upper surface of the printed circuit board and over the at least one light source, wherein the optic comprises a plurality of optics and the at least one light source comprises a plurality of light sources and wherein each of the plurality of optics is positioned over a single one of the plurality of light sources.

18. A light module comprising:

a printed circuit board comprising at least one light source provided on an upper surface of the printed circuit board; and an optic adhered directly to the upper surface of the printed circuit board and over the at least one light source, wherein the optic comprises a plurality of optics and wherein at least some of the plurality of optics are adhered to the upper surface of the printed circuit board in different rotational orientations.

19. A light module comprising:

a printed circuit board comprising at least one light source provided on an upper surface of the printed circuit board; and an optic adhered directly to the upper surface of the printed circuit board and over the at least one light source, wherein the optic comprises a plurality of optics and wherein at least some of the plurality of optics are different.

\* \* \* \* \*